US009523739B2

(12) United States Patent
Gao et al.

(10) Patent No.: US 9,523,739 B2
(45) Date of Patent: Dec. 20, 2016

(54) METHOD AND APPARATUS FOR MEASURING ROTOR RESISTANCE OF INDUCTION MOTOR

(71) Applicant: DELTA ELECTRONICS (Shanghai) CO., LTD., Pudong (CN)

(72) Inventors: Zhi guang Gao, Pudong (CN); Cheng Lu, Pudong (CN)

(73) Assignee: DELTA ELECTRONICS (SHANGHAI) CO., LTD. (CN)

( * ) Notice: Subject to any disclaimer, the term of this patent is extended or adjusted under 35 U.S.C. 154(b) by 938 days.

(21) Appl. No.: 13/846,732

(22) Filed: Mar. 18, 2013

(65) Prior Publication Data

US 2014/0163912 A1    Jun. 12, 2014

(30) Foreign Application Priority Data

Dec. 10, 2012    (CN) .......................... 2012 1 0529513

(51) Int. Cl.
*G01R 31/34* (2006.01)
(52) U.S. Cl.
CPC ................... *G01R 31/34* (2013.01)
(58) Field of Classification Search
CPC ....... G01R 27/02; G01R 31/34; G01R 31/346; G01R 31/343; H02P 23/14; H02P 21/14
(Continued)

(56) References Cited

U.S. PATENT DOCUMENTS 4,670,698 A * 6/1987 Fulton .................. G01R 31/343
318/802
5,998,958 A    12/1999 Lee
(Continued)

FOREIGN PATENT DOCUMENTS

CN    101188398    5/2008
CN    102393507    3/2012
(Continued)

OTHER PUBLICATIONS

Signals and Systems Engineering Functions, Wikibooks, Feb. 16, 2010.*
(Continued)

*Primary Examiner* — Gregory J Toatley
*Assistant Examiner* — Kyle R Quigley
(74) *Attorney, Agent, or Firm* — Hauptman Ham, LLP

(57) ABSTRACT

The present application discloses a method and an apparatus for measuring a rotor resistance of an induction motor, which method comprises: injecting a first voltage step signal into a test phase of the induction motor when the induction motor is at standstill; measuring and recording a current value $I_{0+}$ at an initial moment of the first voltage step signal; and calculating the rotor resistance $R_r$ of the induction motor based on a first current value $I_{s1}$, a second current value $I_{s2}$ and the current value $I_{0+}$ at the initial moment, the first current value $I_{s1}$ being equal to a steady-state current value corresponding to a voltage value before a step of the first voltage step signal, and the second current value $I_{s2}$ being equal to a steady-state current value corresponding to a voltage value after the step of the first voltage step signal.

16 Claims, 10 Drawing Sheets

(58) Field of Classification Search
USPC .................................. 318/798, 801, 802, 811
See application file for complete search history.

(56) References Cited

U.S. PATENT DOCUMENTS

| | | | | |
|---|---|---|---|---|
| 2002/0158658 | A1* | 10/2002 | Godbersen | G01R 31/34 324/545 |
| 2011/0010116 | A1* | 1/2011 | Heikkila | H02P 23/14 702/57 |
| 2014/0167674 | A1* | 6/2014 | Wang | H02P 23/14 318/798 |

FOREIGN PATENT DOCUMENTS

| | | |
|---|---|---|
| CN | 102426337 | 4/2012 |
| CN | 102611382 | 7/2012 |
| EP | 2120329 | 11/2009 |
| JP | H09304489 | 11/1997 |
| TW | 201232004 | 8/2012 |

OTHER PUBLICATIONS

Office Action dated Dec. 1, 2015 from corresponding No. CN 2012105295132.
He, Xiao-rong et al., "Identification Method for Parameters of Induction Machine Based on Dynamic Model", Journal of Chongqing University of Technology Natural Science, vol. 24, No. 7, Jul. 2010, pp. 100-105.
Office Action dated Feb. 25, 2015 from corresponding No. TW 102104726.

\* cited by examiner

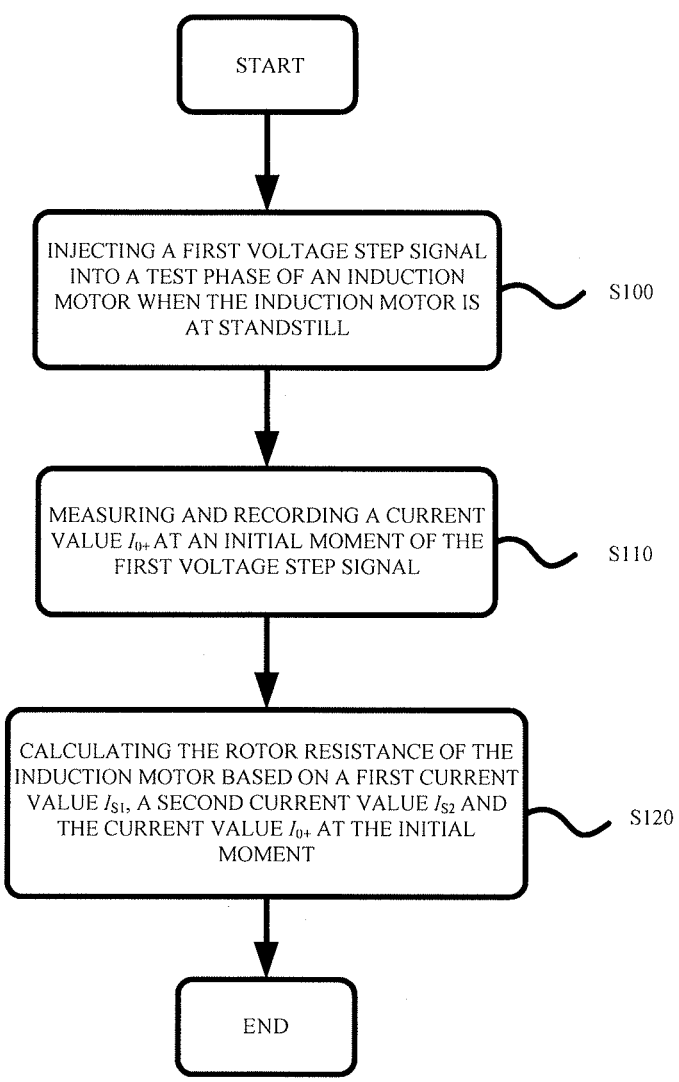

(a) VOLTAGE (b) CURRENT

METHOD AND APPARATUS FOR MEASURING ROTOR RESISTANCE OF INDUCTION MOTOR

CROSS REFERENCE TO RELATED APPLICATIONS

The present application claims priority under 35 U.S.C. §119 to Chinese Patent Application No. 201210529513.2, filed on Dec. 10, 2012, the entire content of which is incorporated herein by reference.

FIELD OF THE INVENTION

The present application relates to measurements of parameters of an induction motor, and particularly to a method and an apparatus for measuring a rotor resistance of an induction motor.

BACKGROUND OF THE INVENTION

The method for identifying a rotor resistance of an induction motor at standstill in prior art is mainly implemented by injecting voltage step signals into the induction motor, collecting current signals within a certain period of time during dynamic variation of a phase current at stator side, calculating a rotor time constant according to equations and the variance of the current during this period of time, and then calculating the rotor resistance under the condition that the rotor inductance is known.

The above method is achieved on the premise that the rotor inductance is known and the rotor time constant is kept to be fixed during the collection of the current. However, in actual process, excitation circuit inductances may vary depending on different excitation current, and thus the rotor time constant is not a fixed value during the whole measurements. Meanwhile, there are some assumed conditions during derivative processes of the equations, and thus the rotor time constant obtained by the above method is only a approximation and only can be used for the occasions where the requirements to the precision of the rotor time constant is low.

The method for identifying the rotor resistance of the induction motor at standstill in prior art has the following problems: the calculation process is complex, and there are too many approximations during the derivative processes which lead to poor precision of the identified results.

SUMMARY OF THE INVENTION

In view of the above-mentioned deficiencies in the background art, an object of the present application is to provide a method and an apparatus for measuring a rotor resistance of an induction motor which could effectively improve the precise of the measuring results.

To achieve the above object, an embodiment of the present application provides a method for measuring a rotor resistance of an induction motor, comprising: injecting a first voltage step signal into a test phase of the induction motor when the induction motor is at standstill; measuring and recording a current value $I_{0+}$ at an initial moment of the first voltage step signal; and calculating the rotor resistance $R_r$ of the induction motor based on a first current value $I_{s1}$, a second current value $I_{s2}$ and the current value $I_{0+}$ at the initial moment, the first current value $I_{s1}$ being equal to a steady-state current value corresponding to a voltage value before a step of the first voltage step signal, and the second current value $I_{s2}$ being equal to a steady-state current value corresponding to a voltage value after the step of the first voltage step signal.

Preferably, the current value $I_{0+}$ at the initial moment is a current value at any time point $T_1$ within a range of $T_0<T_1<T_0+3T_s$, wherein $T_0$ is a time point at which the first voltage step signal is voltage stepped, $$T_s = \frac{L_m + L_\sigma}{R_s},$$

$L_\sigma$ represents a leakage inductance, $L_m$ represents a mutual inductance, and $R_s$ represents a stator resistance.

Preferably, the first current value $I_{s1}$ and the second current value $I_{s2}$ are measured and recorded before and after the step of the first voltage step signal, respectively.

Preferably, before the injecting of the first voltage step signal, the method further comprises: injecting a second signal into the test phase of the induction motor; recording a voltage value of the second signal at a first time point and the first current value $I_{s1}$; and recording a voltage value of the second signal at a second time point and the second current value $I_{s2}$; wherein, the voltage value at the first time point is equal to the voltage value before the step of the first voltage step signal, and the voltage value at the second time point is equal to the voltage value after the step of the first voltage step signal.

Preferably, the second signal is a voltage signal, the first current value $I_{s1}$ is a current value corresponding to the voltage value at the first time point, and the second current value $I_{s2}$ is a current value corresponding to the voltage value at the second time point.

Preferably, the voltage signal is a second voltage step signal, the voltage value at the first time point is a voltage value before the step of the second voltage step signal, and the voltage value at the second time point is a voltage value after the step of the second voltage step signal.

Preferably, the second signal is a current signal, the voltage value at the first time point is a voltage value corresponding to the first current value $I_{s1}$, and the voltage value at the second time point is a voltage value corresponding to the second current value $I_{s2}$.

Preferably, the current signal is a current step signal, the first current value $I_{s1}$ is a current value before the step of the current step signal, and the second current value $I_{s2}$ is a current value after the step of the current step signal.

Preferably, the second current value $I_{s2}$ is a current value after elapse of a time period greater than or equal to $3T_s$ from the step of the first voltage step signal, $$T_s = \frac{L_m + L_\sigma}{R_s},$$

$L_\sigma$ represents a leakage inductance, $L_m$ represents a mutual inductance, and $R_s$ represents a stator resistance.

Preferably, the second current value $I_{s2}$ is a current value after elapse of a time period greater than or equal to $3T_s$ from the step of the second voltage step signal, $$T_s = \frac{L_m + L_\sigma}{R_s},$$

$L_\sigma$ represents a leakage inductance, $L_m$ represents an mutual inductance, and $R_s$ represents a stator resistance.

Preferably, both the first current value $I_{s1}$ and the second current value $I_{s2}$ are less than or equal to $2I_N$, $I_N$ represents a rated current of the induction motor.

Preferably, the rotor resistance $R_r$ is calculated according to an equation $$R_r \approx R_s \cdot \frac{I_{s2} - I_{0+}}{I_{0+} - I_{s1}},$$

in which $R_s$ represents a stator resistance.

Preferably, the first voltage step signal is a positive step signal.

Preferably, a magnitude of a voltage before or after the step of the first voltage step signal is 0.

Preferably, a magnitude of a voltage before the step of the first voltage step signal is negative, and a magnitude of a voltage after the step of the first voltage step signal is positive.

Preferably, the first voltage step signal is a negative step signal.

Preferably, a magnitude of a voltage before or after the step of the first voltage step signal is 0.

Preferably, a magnitude of a voltage before the step of the first voltage step signal is positive, and a magnitude of a voltage after the step of the first voltage step signal is negative.

Preferably, the first voltage step signal is a multi-step voltage step signal.

Preferably, the induction motor is a three-phase induction motor.

Preferably, the method further comprises controlling the three-phase induction motor at standstill, including: setting a voltage input to the test phase of the three-phase induction motor twice as large as a voltage input to the other two phases while setting a direction of the voltage input to the test phase opposite to that of the voltage input to the other two phases; or setting the voltage input to the test phase of the three-phase induction motor equal to a voltage input to one phase of the other two phases while setting the direction of the voltage input to the test phase opposite to that of the voltage input to the one phase, and no voltage is supplied to remaining phase of the other two phases.

Preferably, the method further comprises controlling the three-phase induction motor at standstill, including: setting a current input to the test phase of the three-phase induction motor twice as large as a current input to the other two phases while setting a direction of the current input to the test phase opposite to that of the current input to the other two phases; or setting the current input to the test phase of the three-phase induction motor equal to a current input to one phase of the other two phases while setting the direction of the current input to the test phase opposite to that of the current input to the one phase, and no current is supplied to remaining one phase of the other two phases.

An embodiment in the present application also provides an apparatus for measuring a rotor resistance of an induction rotor, comprising: a power conversion unit configured to coupled to the induction motor; a control unit configured to inject a first voltage step signal into a test phase of the induction motor via the power conversion unit when the induction motor is at standstill; wherein the control unit comprises a rotor resistance calculating unit configured to receive and record a current value $I_{0+}$ at an initial moment of the first voltage step signal and calculate the rotor resistance $R_r$ based on a first current value $I_{s1}$, a second current value $I_{s2}$ and the current value $I_{0+}$ at the initial moment, the first current value $I_{s1}$ being equal to a steady-state current value corresponding to a voltage value before a step of the first voltage step signal, and the second current value $I_{s2}$ being equal to a steady-state current value corresponding to a voltage value after the step of the first voltage step signal.

Preferably, the current value $I_{0+}$ at the initial moment is a current value at any time point $T_1$ within a range of $T_0 < T_1 < T_0 + 3T_s$, wherein $T_0$ is a time point at which the first voltage step signal is voltage stepped, $$T_s = \frac{L_m + L_\sigma}{R_s},$$

$L_\sigma$ represents a leakage inductance, $L_m$ represents a mutual inductance, and $R_s$ represents a stator resistance.

Preferably, the apparatus further comprises a measuring unit configured to measure and record the first current value $I_{s1}$ and the second current value $I_{s2}$ before and after the step of the first voltage step signal, respectively, and the rotor resistance calculating unit is configured to receive and record the first current value $I_{s1}$ and the second current value $I_{s2}$, the first current value $I_{s1}$ being the steady-state current value corresponding to the voltage value before the step of the first voltage step signal, and the second current value $I_{s2}$ being the steady-state current value corresponding to the voltage value after the step of the first voltage step signal and being a current value after elapse of a time period greater than or equal to $3T_s$ from the step of the first voltage step signal, wherein $$T_s = \frac{L_m + L_\sigma}{R_s},$$

$L_\sigma$ represents a leakage inductance, $L_m$ represents a mutual inductance, and $R_s$ represents a stator resistance.

Preferably, the rotor resistance $R_r$ is calculated according to an equation $$R_r \approx R_s \cdot \frac{I_{s2} - I_{0+}}{I_{0+} - I_{s1}},$$

in which $R_s$ represents a stator resistance.

Preferably, the power conversion unit comprises a voltage-type converter; the induction motor is a three-phase induction motor, and the rotor resistance calculating unit is configured to receive and record the current values measured on the test phase of the induction motor.

Preferably, the power conversion unit comprises a current-type converter; the induction motor is a three-phase induction motor, the control unit further comprises a current adjuster, and the rotor resistance calculating unit is configured to receive and record the current values output from the current adjuster.

Preferably, the control unit is configured to set a voltage input to the test phase of the three-phase induction motor twice as large as a voltage input to the other two phases while set a direction of the voltage input to the test phase opposite to that of the voltage input to the other two phases;

or the control unit is configured to set the voltage input to the test phase of the three-phase induction motor equal to a voltage input to one phase of the other two phases while set the direction of the voltage input to the test phase opposite to that of the voltage input to the one phase, and no voltage is supplied to remaining one phase of the other two phases, such that the three-phase induction motor is at standstill.

Preferably, the control unit is configured to set a current input to the test phase of the three-phase induction motor twice as large as a current input to the other two phases while set a direction of the current input to the test phase opposite to that of the current input to the other two phases; or the control unit is configured to set the current input to the test phase of the three-phase induction motor equal to a current input to one phase of the other two phases while set the direction of the current input to the test phase opposite to that of the current input to the one phase, and no current is supplied to remaining one phase of the other two phases, such that the three-phase induction motor is at standstill.

From above, the present application has the following beneficial effects: the calculation processes may be simplified, and the consistence and precise of the plurality of measuring results may be enhanced.

The above and other objects, features and advantages of the present application will become more apparent through the following description of preferred embodiments with reference to the accompanying drawings.

BRIEF DESCRIPTION OF THE DRAWING

FIG. 5 is a flowchart illustrating a method for measuring a rotor resistance of the induction motor in the present application.

DESCRIPTION OF THE PREFERRED EMBODIMENTS

Hereinafter, the embodiments of the present application will be described in detail. It shall be noted that the embodiments described herein are only for illustration, but not to limit the present application. Moreover, in the following description, "an embodiment" or "embodiment" appeared in different places may not refer to the same embodiment. In addition, the specific feature, structure and characteristic in one or more embodiments can be combined in any appropriate way.

Firstly, an equivalent circuit of an induction motor will be explained as follows.

Figure 1:
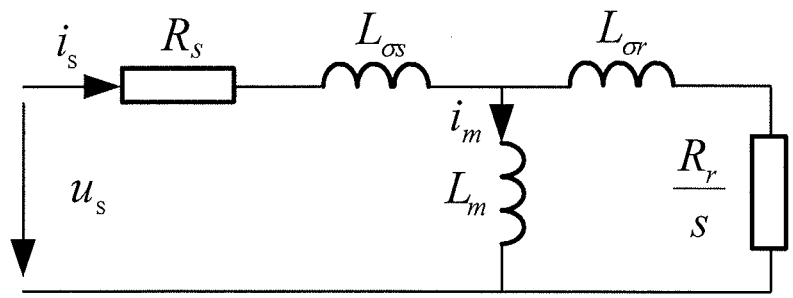
FIG. 1 is a T-type steady-state equivalent circuit diagram of an induction motor.

Generally, the induction motor is described using the typical T-type steady-state equivalent circuit shown in FIG. 1.

In FIG. 1, $R_s$ represents a stator resistance, $R_r$ represents a rotor resistance, $L_{\sigma s}$ represents a leakage inductance of the stator winding, $L_{\sigma r}$ represents a leakage inductance of the rotor winding, $L_m$ represents an excitation inductance, s represents a slip, self-inductance of the stator winding $L_s=L_m+L_{\sigma s}$, self-inductance of the rotor winding $L_r=L_m+L_{\sigma r}$, $u_s$ represents a phase voltage, $i_s$ represents a phase current, and $i_m$ represents an excitation current.

Figure 2:
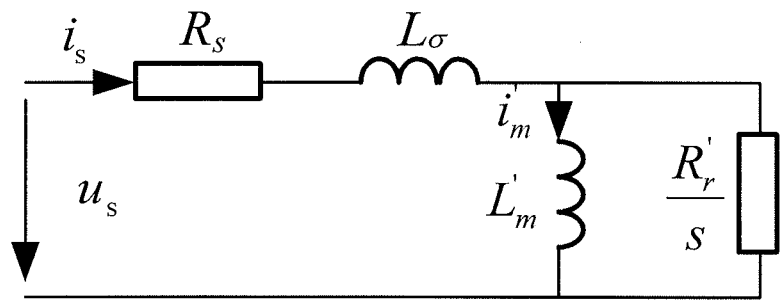
FIG. 2 is a T-II type steady-state equivalent circuit diagram of the induction motor.

In practice, when the induction motor is used as an object to be controlled for performing a high performance vector control of a rotor flux linkage orientation, a T-II type steady-state equivalent circuit shown in FIG. 2 is generally adopted.

In FIG. 2, $R_s$ represents a stator resistance, $R_r'$ represents a rotor resistance, $L_\sigma$ represents a total leakage inductance, $L_m'$ represents an excitation inductance, s represents a slip, $u_s$ represents a phase voltage, $i_s$ represents a phase current, and $i_m'$ represents an excitation current.

The T-type and T-II type steady-state equivalent circuits are totally equivalent to each other, and the T-II type steady-state equivalent circuit is constructed from the view that the total rotor flux linkage is kept constant. A relationship between the two types of steady-state equivalent circuits is: $R_s$ is maintained constant;

$$L_\sigma = \left(1 - \frac{L_m^2}{L_s L_r}\right) \cdot L_s; \; L_m' = \frac{L_m^2}{L_r}; \; R_r' = \left(\frac{L_m}{L_r}\right)^2 \cdot R_r.$$

Without loss of generality, the methods or apparatuses described hereinafter taking the T-II type steady-state equivalent circuit as an example could also be applied to T-type equivalent circuits or any other equivalent circuits known by those skilled in the art.

Figure 3:
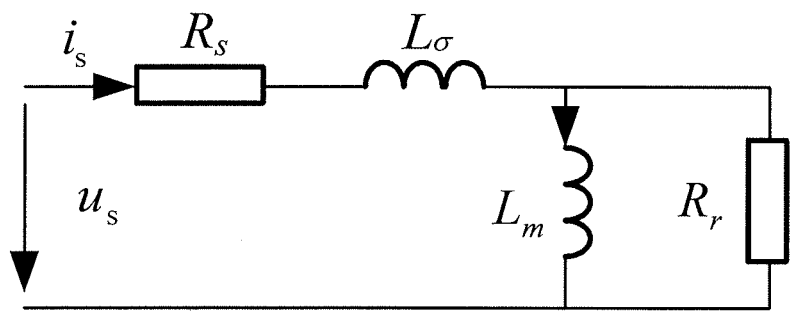
FIG. 3 is a T-II type steady-state equivalent circuit diagram of the induction motor at standstill.

The principle of identifying the rotor resistance of the induction rotor at standstill (s=1) are described by taking the T-II type steady-state equivalent circuit shown in FIG. 3 as an example. For simplicity, the parameters of the induction rotor in the equivalent circuit (the stator resistance, the rotor resistance, the total leakage inductance, the excitation inductance) are respectively represented by the symbols including $R_s$, $R_r$, $L_\sigma$, $L_m$.

Hereinafter, the principle will be analyzed on the basis of the equivalent circuit shown in FIG. 3.

In order to achieve an excellent vector control performance of the induction motor, it is necessity to know the rotor resistance $R_r$. However, in general, the rotor resistance $R_r$ of the induction motor is impossible or inconvenient to be measured directly. Thereby, it is desirable to obtain the rotor resistance $R_r$ of the induction motor by indirect measurements. Hereinafter, the principle of identifying the rotor resistance will be described.

In FIG. 3, $R_s$ represents a stator resistance, $R_r$ represents a rotor resistance, $L_\sigma$ represents a total leakage inductance, $L_m$ represents an mutual inductance, $u_s$ represents a phase voltage, and $i_s$ represents a phase current.

From illustration of FIG. 3, a transfer function G(S), i.e., a ratio of the phase current $i_s$ to the phase voltage $u_s$ may be expressed as the following equation (1):

$$\frac{i_s(S)}{u_s(S)} = G(S) = \frac{1}{R_s} \cdot \frac{1 + T_r \cdot S}{1 + (T_r + T_s) \cdot S + kT_rT_s \cdot S^2} \quad (1)$$

wherein $$T_r = \frac{L_m}{R_r}; T_s = \frac{L_m + L_\sigma}{R_s}; k = \frac{L_\sigma}{L_\sigma + L_m};$$

and S is a complex frequency.

In the equation (1), if an angular frequency is within the region of $$\omega << \frac{T_r + T_s}{kT_rT_s} \text{(rad/sec)},$$

the following equation (2) could be obtained approximatively.

$$G^*(S) = \frac{1}{R_s} \cdot \frac{1 + T_r \cdot S}{1 + (T_r + T_s) \cdot S} \quad (2)$$

$$= \frac{T_r}{R_s(T_r + T_s)} + \frac{T_s}{R_s(T_r + T_s)} \cdot \frac{1}{1 + (T_r + T_s) \cdot S}$$

From above, the current varies depending on the time constant $(T_s + T_r)$.

Figure 4A:
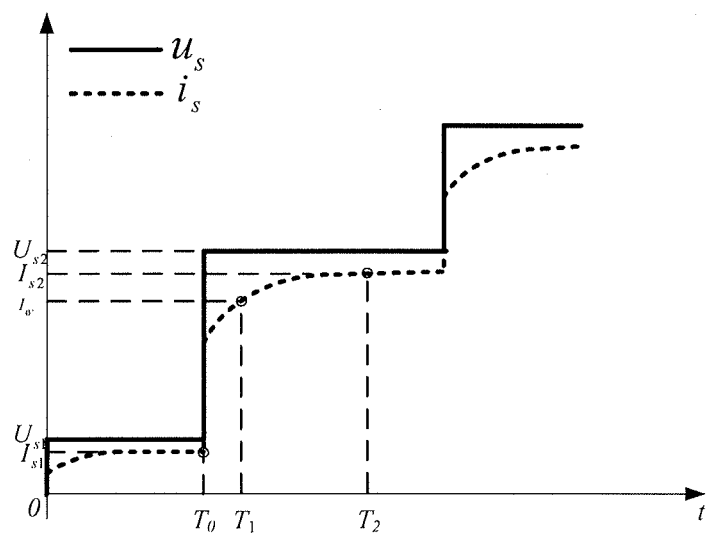
FIGS. 4A-4C are schematic diagrams of multi-step voltage step waveform and motor current waveform.
Figure 4B:
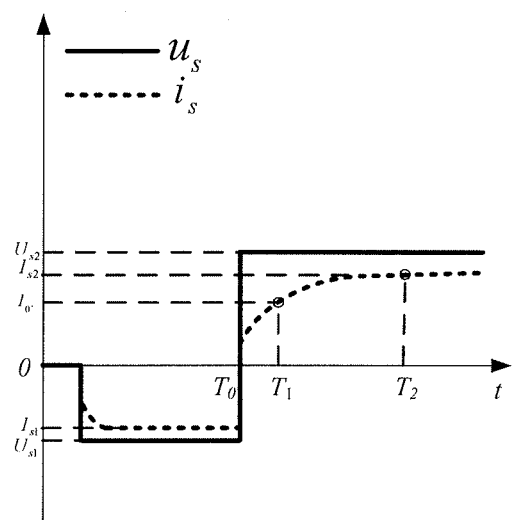
Figure 4C:
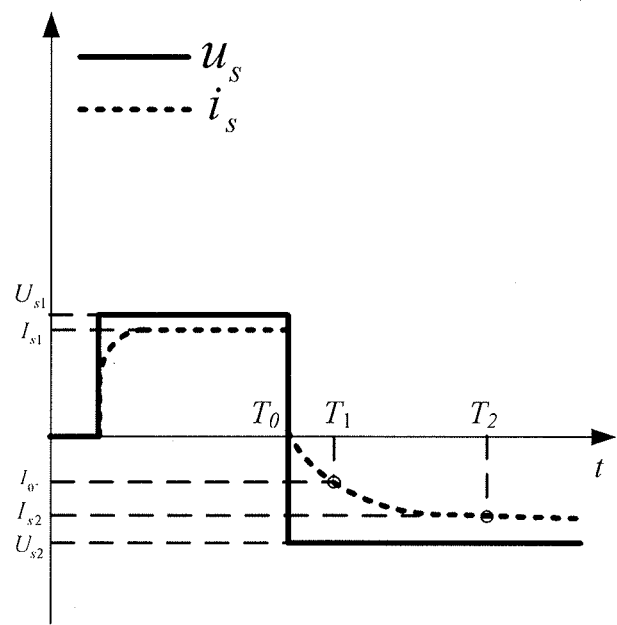

Referring to FIGS. 4A-4C, if injecting a multi-step voltage step signal and selecting any step of the step signal therein, the voltage and current before the step are already in steady state, the input voltage in the initial state before the step is $u_s(0^-) = U_{s1}$, the initial current value $i_s(0^-) = I_{s1}$, and a voltage step command $u_s(0) = U_{s1} + \Delta U = U_{s2}$ is input when $t = T_0$, wherein $\Delta U$ represents a difference between the voltages before and after the step. According to the final value theorem $(S \to 0)$, the current after elapse of a long enough time period from the step is $i_s(\infty) = I_{s2}$. That is, at the moment when the step voltage is applied to the induction motor, the current $i_s(0^+)$ is obtained by the initial theorem $(S \to \infty)$:

$$i_s(0^+) = I_{0+} = \frac{T_r}{T_r + T_s} \cdot I_0 \quad (3)$$

wherein $I_0 = I_{s2} - I_{s1} = \frac{U_{s2} - U_{s1}}{R_s}$, which is a difference value between a first current value $I_{s1}$ (i.e., the steady current before the step) and a second current value $I_{s2}$ (i.e., the steady current after the step response).

The following equation (4) can be obtained by substituting the equations $$T_s = \frac{L_m + L_\sigma}{R_s} \text{ and } T_r = \frac{L_m}{R_r}$$

into the above equation (3).

$$i_s(0^+) = I_{0+} = \frac{\frac{L_m}{R_r}}{\frac{L_m}{R_r} + \frac{L_m + L_\sigma}{R_s}} \cdot I_0 \quad (4)$$

At the moment that the voltage is stepped, the current varies quickly, the excitation circuit is approximately open, the current is closed mainly via the rotor circuit, the current in the excitation circuit is very small, and $L_m >> L_\sigma$ is satisfied at this time, so the equation (4) can be simplified as:

$$I_{0+} \approx \frac{R_s}{R_s + R_r} \cdot I_0 \quad (5)$$

The rotor resistance $R_r$ can be solved approximately by using the following equation (5):

$$R_r \approx R_s \cdot \frac{I_{s2} - I_{0+}}{I_{0+} - I_{s1}} \quad (6)$$

wherein $I_{s1}$ is the steady-stage current before the voltage step, and $I_{s2}$ is the steady-state current after the voltage step.

Those skilled in the art could understand, generally, the voltage and current could be in steady state after a time period of $3T_s$ from the time point of step.

Therefore, the steady-state current after the step response in the present application is defined to be the current value at arbitrary time point after elapse of the time period of $3T_s$ from the time point of voltage step.

The steady-state voltage after the step response in the present application is defined to be the voltage value at arbitrary time point after elapse of the time period of $3T_s$ from the time point of current step.

$I_{0+}$ is a current value corresponding to time point $T_1$ at which the effect of the dynamic variation of the current due to the leakage inductance could be ignored. In general, $T_1$ satisfies $T_0 < T_1 < T_0 + 3T_s$.

FIGS. 4A-4C show injecting manners for three kind of typical multi-step voltage step signals, all of which can be adopted to identify the rotor resistance.

Based on the above analysis to the principle of the equivalent circuit of the induction motor, the method for measuring the rotor resistance of the induction motor in the present application may include the following steps as shown in FIG. 5.

Step 100: injecting a first voltage step signal into a test phase of the induction motor when the induction motor is at standstill;

Step 110: measuring and recording a current value $I_{0+}$ at an initial moment of the first voltage step signal; and Step 120: calculating the rotor resistance $R_r$ of the induction motor based on a first current value $I_{s1}$, a second current value $I_{s2}$ and the current value $I_{0+}$ at the initial moment, wherein the first current value $I_{s1}$ is equal to a steady-state current value corresponding to a voltage value of the first voltage step signal before the step, and the second current value $I_{s2}$ is equal to a steady-state current value corresponding to a voltage value of the first voltage step signal after the step.

The method for measuring the rotor resistance of the induction motor in the present application can simplify the calculation processes and enhance the consistence and precise of the plurality of measuring results.

Hereinafter, the specific embodiments of the method and apparatus for measuring the rotor resistance of the induction motor in the present application will be described in detail.

The First Embodiment

Figure 6A:
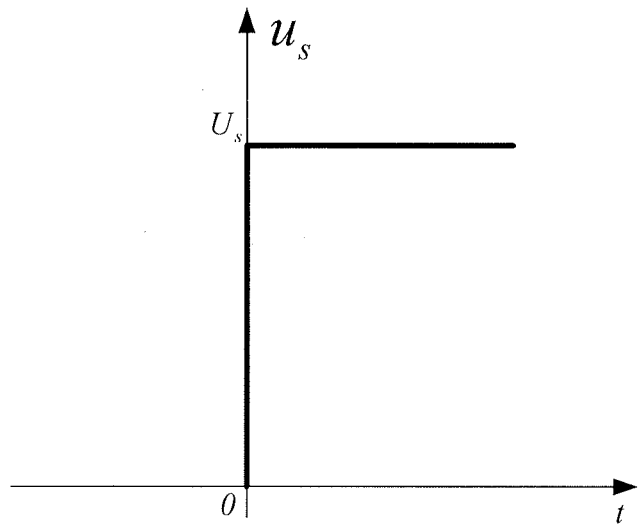
FIG. 6A is a schematic diagram of a voltage variation according to the first embodiment in the present application.
Figure 6B:
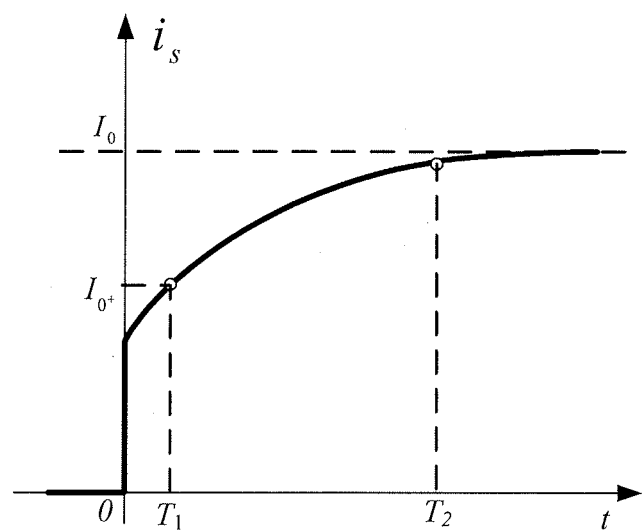
FIG. 6B is a schematic diagram of a current variation according to the first embodiment in the present application.

As shown in FIGS. 6A-6B, provided that the voltage step signal is a positive step signal with a value of 0 before the step, the input voltage at the initial state is $u_s(0^-)=U_{s1}=0$, and the current initial value $i_s(0^-)=I_{s1}=0$. When $t=T_0=0$, the step voltage command $u_s(0)=U_{s2}=U_s$ is input, wherein $U_s$ is a difference value between the voltage step signals before and after the step. According to the final value theorem (S→0), the current after elapse of a long enough time period is $i_s(\infty)=I_{s2}=I_0$, i.e., $$I_0 = \frac{U_s}{R_s}.$$

The rotor resistance $R_r$ can be solved approximately according to the above equation (6):

$$R_r \approx R_s \cdot \frac{I_0 - I_{0+}}{I_{0+}} \quad (7)$$

The specific implementation processes are as follows.

Firstly, a first voltage step signal with a magnitude of $0 \rightarrow U_s$ as shown in FIG. 6A is injected into the induction motor, and then a current waveform $i_s$ shown in FIG. 6B will be generated within the induction motor. At the time point of $t=T_1$, i.e., the time point at which the effect of the dynamic variation of the current due to the leakage inductance can be ignored, a current value is measured and recorded, which current value is the current $I_{0+}$ at the initial moment, wherein $T_0<T_1<T_0+3T_s$, i.e., $0<T_1<3T_s$ (in the present embodiment, the time point $T_0$ is a time point of $t=0$). After elapse of a long enough time period, the response current tends to be steady, and its current value is $I_0$ which is also be measured and recorded, wherein the time point at which the current tends to be steady is an arbitrary time point after $t \geq 3T_s$.

The rotor resistance can be calculated accurately based on the equation (7). Herein, it is supposed that the stator resistance $R_s$ is known.

In an embodiment, an actual current of the induction motor is collected directly by a Hall element, and the rotor resistance is calculated by using the equation (7), such that the calculating precise of the rotor resistance can be improved.

In an embodiment of the present application, the induction motor is a three-phase induction motor, and a phase (i.e., test phase) whose current magnitude is the largest is selected for the current collection.

In the present embodiment, the first voltage step signal is a positive step signal with a value of 0 before the step. In other embodiments, the first voltage step signal may be a positive step signal with a value of 0 after the step or may be a positive step signal which is negative before the step and is positive after the step. The first voltage step signal also may be a multi-step voltage step signal. In these cases, the rotor resistance $R_r$ also can be calculated accurately according to the equation (6) or (7), which are omitted for brief.

In addition, it should be noted that the measurement of the rotor resistance in the present application is implemented on the premise that the induction motor is at standstill. Thus, it is necessary to inject a certain voltage signal or current signal into the induction motor for making the induction motor not generate rotary magnetic field or torque.

Those skilled in the art could understand, there are many manners in prior art for making the induction motor at standstill. The present application adopts the following two manners for making the induction motor at standstill, but is not limited thereto.

The first manner: injecting a voltage vector signal with any angle in a range of 360° space into the induction motor, for example, injecting a voltage vector signal with 0° space. The description is made on the assumption that the test phase is a-phase, and in this case the following relation is satisfied:

$$u_a = -2u_b = -2u_c \text{ or } i_a = -2i_b = -2i_c$$

wherein the test phase (i.e., a-phase) is a phase which receives the input voltage step signal, and b-phase and c-phase are non-test phase. That is, the voltage input to the test phase is twice as large as the voltage on the other two phases and the direction of the voltage on the test phase is opposite to that on the other two phases; or the current input to the test phase is twice as large as the current on the other two phases and the direction of the current on the test phase is opposite to that on the other two phases.

The second manner: the magnitude of the measuring current or voltage supplied to the test phase of the induction motor is equal to that of the current or voltage supplied to one non-test phase, the direction of the current or voltage supplied to the test phase of the induction motor is opposite to that of the current or voltage supplied to the one non-test phase, and voltage or current are not supplied to the other non-test phase of the induction motor.

The Second Embodiment

Figure 7A:
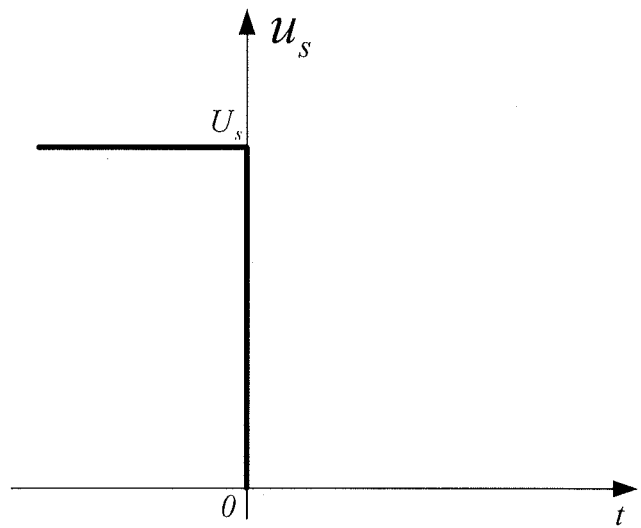
FIG. 7A is a schematic diagram of a voltage variation according to the second embodiment in the present application.
Figure 7B:
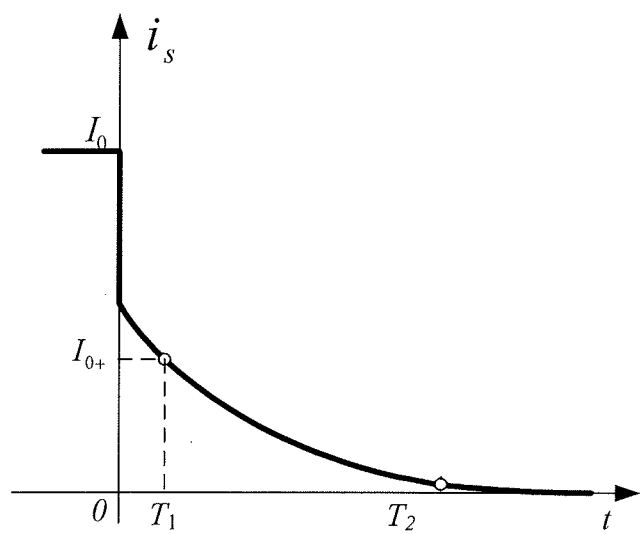
FIG. 7B is a schematic diagram of a current variation according to the second embodiment in the present application.

In addition to the injection of the positive step voltage signals in the first embodiment, it is allowable to inject negative step voltage signals as shown in FIGS. 7A-7B. The analysis are as follows: supposing that the voltage step signal is a negative step signal with a voltage value of 0 after the step, the input voltage in the initial state is $u_s(0^-)=U_{s1}=U_s$, and the initial current value is $i_s(0^-)=I_{s1}=I_0$. When $t=0$, a step voltage command $u_s(0)=U_{s2}=0$ is input, wherein $U_s$ is a difference value between the voltage step signals before and after the step. According to the final value theorem (S→0), the current after elapse of a long enough time period is $i_s(\infty)=I_{s2}$. When the input voltage of the induction motor descents to zero instantly, the rotor resistance $R_r$ can be solved approximatively according to the above equation (6):

$$R_r \approx R_s \cdot \frac{I_{0+}}{I_0 - I_{0+}} \quad (8)$$

The specific implementation processes are as follows:

Firstly, a first step voltage signal with a magnitude of $U_s \rightarrow 0$ as shown in FIG. 7A is injected into the induction motor, and then a current waveform $i_s$ shown in FIG. 7B will be generated within the induction motor. The initial current value is $I_0$ which is measured and recorded. At the time point of $t=T_1$, i.e., the time point at which the effect of the dynamic variation of the current due to the leakage inductance can be ignored, a current value is measured and recorded, which current value is the current $I_{0+}$ at the initial moment, wherein $T_0 < T_1 < T_0 + 3T_s$, i.e., $0 < T_1 < 3T_s$ (in the present embodiment, the time point $T_0$ is a time point of $t=0$), and the time point when the current is 0 is any time point after $t \geq 3T_s$.

The rotor resistance can be calculated accurately based on the equation (8). Herein, it is supposed that the stator resistance $R_s$ is known.

In the present embodiment, the first voltage step signal is a negative step signal with a value of 0 after the step. In other embodiments, the first voltage step signal may be a negative step signal with a value of 0 before the step or may be a negative step signal which is positive before the step and negative after the step. In these cases, the rotor resistance $R_r$ also can be calculated accurately according to the equation (6) or (8), which are omitted for brief.

The Third Embodiment

In the above first and second embodiments, the current value $I_{0+}$ at the initial moment, the first current value $I_{s1}$, and the second current value $I_{s2}$ are obtained by injecting the first voltage step signal into the induction motor. While in the following embodiments, the first current value $I_{s1}$ and the second current value $I_{s2}$ are obtained by injecting a second signal into the induction motor, and the current value $I_{0+}$ at the initial moment is obtained by injecting the first voltage step signal.

The method and process of obtaining the current value $I_{s1}$ and $I_{s2}$ are explained as follows.

In the present embodiment, the second signal injected into the induction motor is a second voltage step signal with a voltage value of $U_{s1}$ before the step and a voltage value of $U_{s2}$ after the step. When such signal is injected into the induction motor, a current response is generated within the induction motor, and after a time period of $t \geq T_2(=3T_s)$, the current comes into a steady state. The steady-state current value $I_{s1}$ before the voltage step and the steady-state current value $I_{s2}$ after the step are measured and recorded. After that, the injected voltage step signals are cut off.

Figure 8:
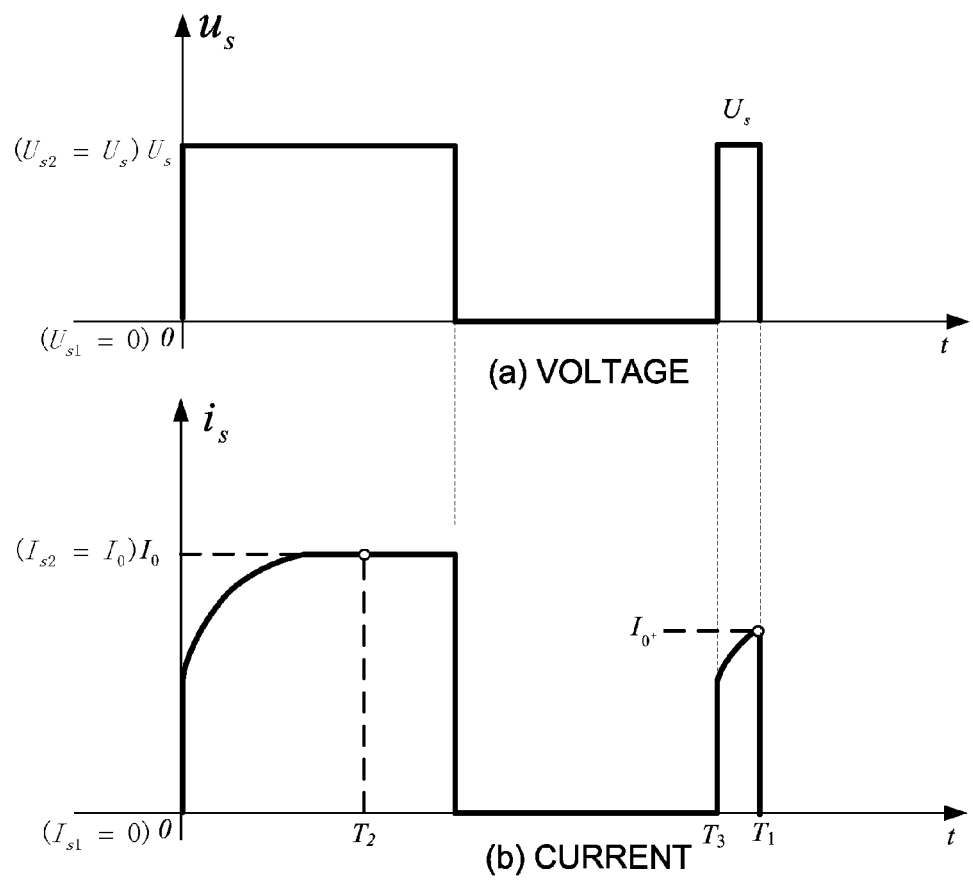
FIG. 8 is a schematic diagram of voltage and current variations according to the third embodiment in the present application.

Taking FIG. 8 as an example, a positive voltage step voltage with a value of 0 before the step is injected as the second voltage step signal, and the voltage value after the step is $U_{s2}$ (difference value=$U_s$). Then, a current signal will be generated within the induction motor shown in part (b) of FIG. 8. The steady-state current $I_{s1}$ before the step of the voltage step signal is 0, and after a time period of $T_2(=3T_s)$, the steady-state current $I_{s2}$ in response to the step is $I_0$.

Hereinafter, the processes of how to measure the rotor resistance will be explained. At the time point of $t=T_3$ after cutting off the second voltage step signal, the first voltage step signal is injected into the induction motor. This first voltage step signal has a voltage value of $U_{s1}$ before the step and a voltage value of $U_{s2}$ after the step. As shown in part (a) of FIG. 8, $U_{s1}$ is 0 and $U_{s2}$ is $U_s$. When $t=T_1(T_3 < T_1 < T_3 + 3T_s)$, the first embodiment may be referred to. The current value at the time point of $T_1$ is the current value $I_{0+}$ at the initial moment, which is measured and recorded. Considering that the injected first voltage step signal has a voltage value of 0 before the step and a voltage value of $U_s$ after the step and the steady-state current value in response to the step tends to be $I_0$, which are the same with the steady-state voltage value $U_s$ and the steady-state current value $I_0$ of the second voltage step signal, it is unnecessary to record them repeatedly. Thus, after the measurement and recordation of the current value $I_{0+}$ at the time point of $T_1$, the test process ends. In the case that the current values $I_{0+}$ and $I_0$ are obtained, the rotor resistance can be calculated accurately based on the equation (7). Herein, it is supposed that the stator resistance $R_s$ is known.

The method and process of obtaining the current values $I_{s1}$ and $I_{s2}$ are implemented by injecting a second voltage step signal from $U_{s1}$ to $U_{s2}$ into the induction motor. However, injection of the second voltage step signal is only a preferred implementation way, and the second signal also may be a voltage signal with arbitrary waveforms having a voltage value of $U_{s1}$ at a first time point and a voltage value of $U_{s2}$ at a second time point, such as a step wave, a slope wave, etc.

The Fourth Embodiment

In the preceding embodiments, a second voltage step signal is injected directly. However, if the magnitude of the voltage value $U_{s1}$ before the step or the magnitude of the voltage value $U_{s2}$ after the step is too large, the induction motor may be damaged due to overcurrent. Thus, it is necessary to inject a signal with a proper voltage magnitude. In the following, the method of how to obtain $U_{s1}$ and $U_{s2}$ and measure the rotor resistance will be given.

Firstly, the method and process of obtaining $U_{s1}$ and $U_{s2}$ are explained. In the present embodiment, the second signal injected into the induction motor is a current step signal with a current value of $I_{s1}$ before the step and a current value of $I_{s2}$ after the step, wherein $I_{s1}$, $I_{s2} \leq 2I_N$, $I_N$ is a rated current of the induction motor. When such signal is injected into the induction motor, a voltage response will be generated within the induction motor, and after elapse of a time period of $t \geq T_2(=3T_s)$, the voltage comes into the steady state. The voltage steady-stage value $U_{s1}$ before the current step and the voltage steady-stage value $U_{s2}$ after the step are measured and recorded, and then the current step signal is cut off.

Figure 9:
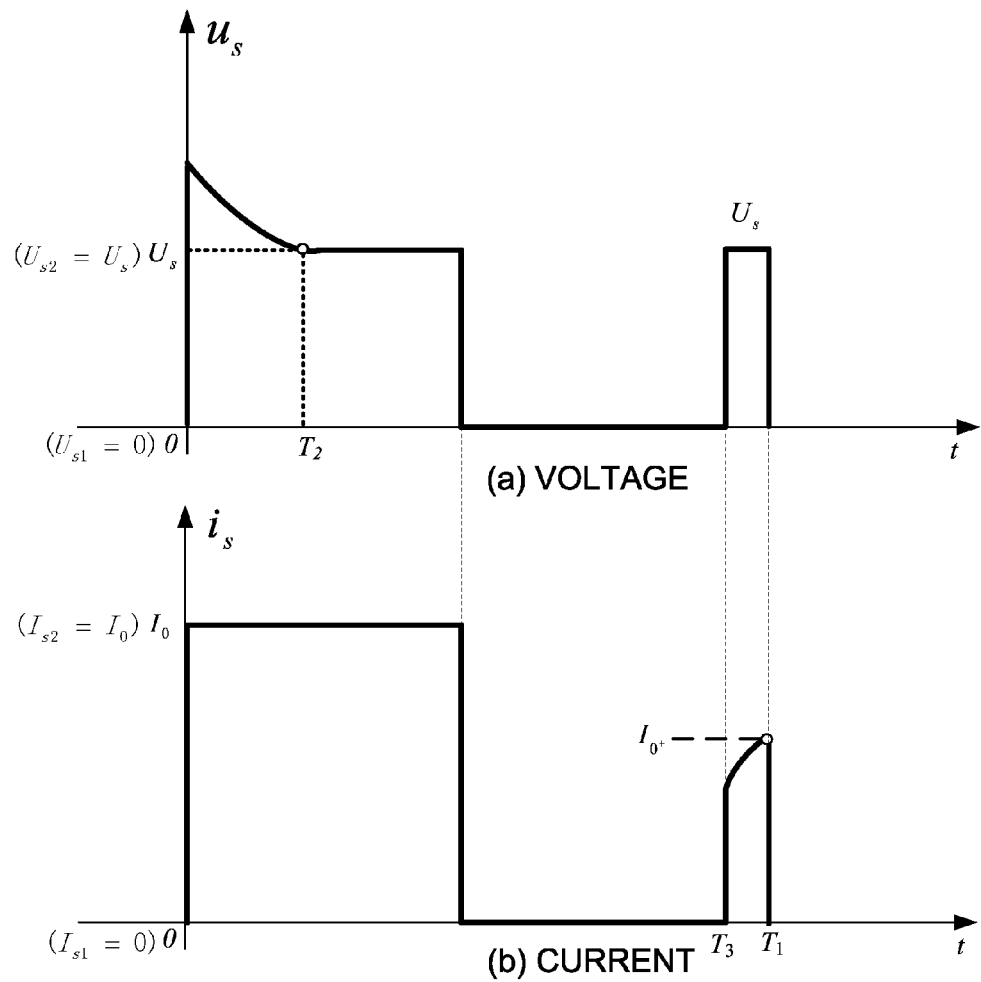
FIG. 9 is a schematic diagram of voltage and current variations according to the fourth embodiment in the present application.

As shown in part (b) of FIG. 9, a positive current step voltage with a value of 0 before the step is injected as the second current step signal, and the current value after the step is $I_{s2}$ (difference value=$I_0$). Then, a voltage signal will be generated within the induction motor shown in part (a) of FIG. 9. The steady-state voltage $U_{s1}$ before the step of the second current step signal is 0, and after elapse of a time period of $T_2(=3T_s)$, the steady-state voltage $U_{s2}$ in response to the step is $U_s$.

Hereinafter, the processes of how to measure the rotor resistance will be explained. At elapse of the time period of $t=T_3$ after cutting off the current step signal, the first voltage step signal is injected into the induction motor. This first voltage step signal has a voltage value of $U_{s1}$ before the step and a voltage value of $U_{s2}$ after the step. As shown in part (a) of FIG. 9, $U_{s1}$ is 0 and $U_{s2}$ is $U_s$. When $t=T_1(T_3 < T_1 < T_3 + 3T_s)$, the first embodiment may be referred to. The current value at the time point of $T_1$ is the current value $I_{0+}$ at the initial moment, which is measured and recorded.

Considering that the injected first voltage step signal has a voltage value of 0 before the step and a voltage value of $U_s$ after the step and the steady-state current value in response to the step tends to be $I_0$, which are the same as the steady-state voltage value $U_s$ and the steady-state current value $I_0$ of the current step signal, respectively, it is unnecessary to record them repeatedly. Thus, after the measurement and recordation of the current value $I_{0+}$ at the time point of $T_1$, the test process ends. In the case that the current values $I_{0+}$ and $I_0$ are obtained, the rotor resistance can be calculated accurately based on the equation (7). Herein, it is supposed that the stator resistance $R_s$ is known.

The method and process of obtaining the voltage values $U_{s1}$ and $U_{s2}$ are adopted by injecting a current step signal from $I_{s1}$ to $I_{s2}$ into the induction motor. However, this injection of current step signal is only a preferred implementation way, and the second signal also may be a current signal with arbitrary waveforms having a first current value of $I_{s1}$ at a first time point and a second current value of $I_{s2}$ at a second time point, such as a step wave, a slope wave, etc.

The Fifth Embodiment

In the above third and fourth embodiments, the voltage magnitude $U_{s1}$ and the current magnitude $I_{s1}$ before the step and the voltage magnitude $U_{s2}$ and the current magnitude $I_{s2}$ in the steady state after the step are obtained by injecting a second voltage step signal or a current step signal into the induction motor.

In practice, in order to reduce the time period required for measuring all the parameters of the induction motor and optimize the identification process, $U_{s1}$, $U_{s2}$, $I_{s1}$ and $I_{s2}$ can be calculated, measured and recorded while identifying the other parameters (such as the stator resistance $R_s$).

Figure 10:
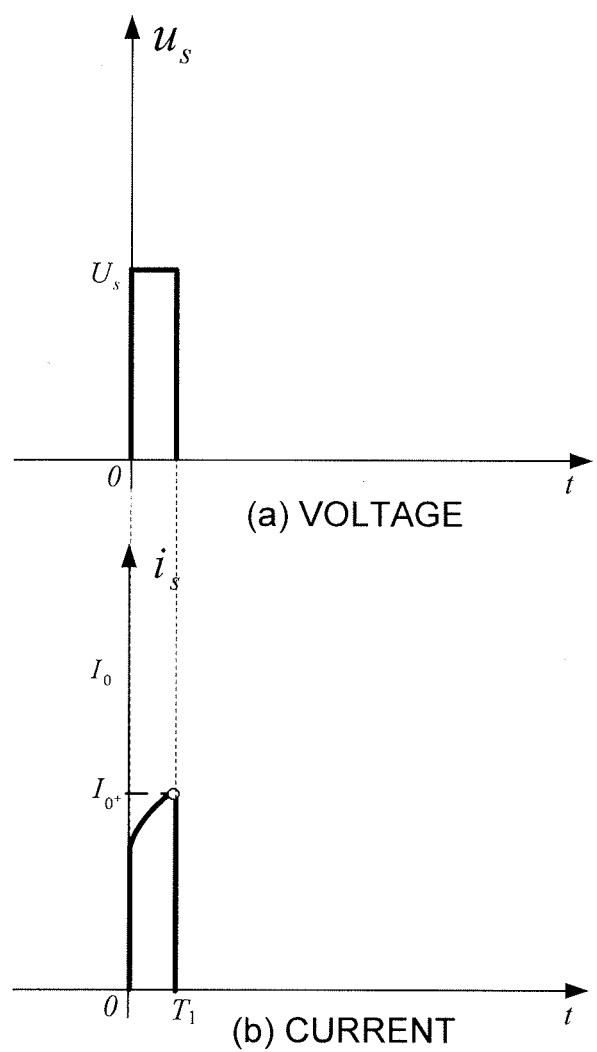
FIG. 10 is a schematic diagram of voltage and current variations according to the fifth embodiment in the present application.

After obtaining $U_{s1}$, $U_{s2}$, $I_{s1}$ and $I_{s2}$, a first voltage step signal is injected into the induction motor which has a voltage value of $U_{s1}$ before the step and a voltage value of $U_{s2}$ after the step. The current value at the time point of $t=T_1$ is the current value $I_{0+}$ at the initial moment, which value is measured and recorded, and then the test process ends. It is unnecessary to continue to inject the voltage signal, and the waveform shown in FIG. 10 can be obtained. The rotor resistance can also be calculated accurately based on the equation (7). Herein, it is supposed that the stator resistance $R_s$ is known.

Figure 11:
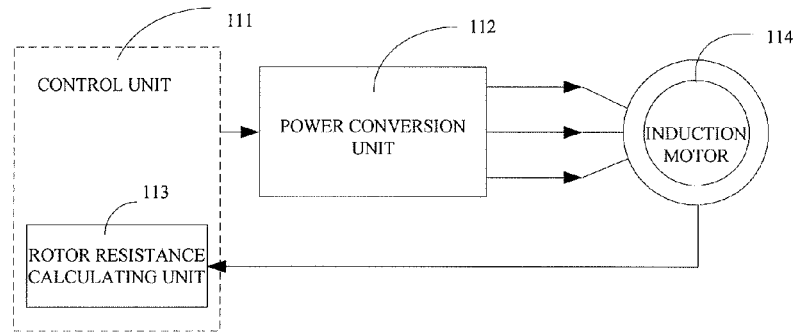
FIG. 11 is a block diagram illustrating an apparatus for measuring the rotor resistance of the induction motor according to an embodiment in the present application.

Referring to FIG. 11, the present application also proposes an apparatus for measuring the rotor resistance of the induction rotor, which apparatus is used for measuring the rotor resistance of the induction motor 114 and includes a control unit 111, and a power conversion unit 112 coupled to the induction motor 114.

The control unit 111 is configured to inject a first voltage step signal into a test phase of the induction motor 114 via the power conversion unit 112 when the induction motor 114 is at standstill.

Further, the control unit 111 includes a rotor resistance calculating unit 113 configured to receive and record a current value $I_{0+}$ at the initial moment of the first voltage step signal from the induction motor 114, and calculate the rotor resistance $R_r$ based on a first current value $I_{s1}$, a second current value $I_{s2}$ and the current value $I_{0+}$ at the initial moment, wherein the first current value $I_{s1}$ is equal to a steady-state current value corresponding to a voltage value of the first voltage step signal before the step, and the second current value $I_{s2}$ is equal to a steady-state current value corresponding to a voltage value of the first voltage step signal after the step.

In addition, the power conversion unit 112 is configured to convert the power of the signal output from the control unit 111 into the first voltage step signal and then input it into the induction motor 114 such that current having corresponding dynamic variation is generated within the induction motor 114. The power conversion unit 112 includes, but not limited to a voltage-type converter or a current-type converter.

According to the an embodiment, the apparatus for measuring the rotor resistance of the induction rotor further comprises a measuring unit configured to measure and record the first current value $I_{s1}$ and the second current value $I_{s2}$ before and after the step of the first voltage step signal, respectively. The rotor resistance calculating unit 113 is configured to receive the current signal generated in the induction motor due to the first voltage step signal, which is measured and recorded by the measuring unit, and calculate the rotor resistance $R_r$ according to the equation $$R_r \approx R_s \cdot \frac{I_{s2} - I_{0+}}{I_{0+} - I_{s1}},$$

wherein $$T_s = \frac{L_m + L_\sigma}{R_s},$$

$L_\sigma$ is a leakage inductance, $L_m$ is a mutual inductance, and $I_{0+}$ is a current value at arbitrary time point within the range of $T_0 < t < 3T_s$, $T_0$ is a time point at which the voltage is stepped.

In an embodiment, the rotor resistance calculating unit 113 may be provided in the control unit 111.

In order to perform the test at the standstill of the induction motor, it is necessary to inject a certain voltage signal or current signal into the induction motor 114 via the power conversion unit 112 such that the induction motor 114 does not generate rotary magnetic field or torque.

Those skilled in the art could understand, there are many manners in prior art for making the induction motor at standstill. The present application adopts the following two manners for making the induction motor at standstill, but is not limited thereto.

The first manner: injecting a voltage vector signal with any angle in a range of 360° space into the induction motor 114 via the power conversion unit 112, for example, injecting a voltage vector signal with 0° space. The description is made on the assumption that the test phase is a-phase, and in this case the following relation is satisfied:

$$u_a = -2u_b = -2u_c \text{ or } i_a = -2i_b = -2i_c$$

wherein the test phase (i.e., a-phase) is a phase which receives the input voltage step signal, and b-phase and c-phase are non-test phase. That is, the voltage input to the test phase is twice as large as the voltage on the other two phases and the direction of the voltage on the test phase is opposite to that on the other two phases; or the current input to the test phase is twice as large as the current on the other two phases and the direction of the current on the test phase is opposite to that on the other two phases.

The second manner: the magnitude of the measuring current or voltage supplied to the test phase of the induction motor 114 by the power conversion unit 112 is equal to that of the current or voltage supplied to one non-test phase of the induction motor 114, the direction of the current or voltage supplied to the test phase of the induction motor 114 is opposite to that of the current or voltage supplied to the one non-test phase, and the other non-test phase of the induction motor 114 is not electrically connected to the power conversion unit 112 or the power conversion unit 112 does not supply voltage or current to the other non-test phase of the induction motor 114. For example, it may be achieved by cutting off the power devices of a bridge arm of the power conversion unit 112 connected to the non-test phases such that the current can not flow into the non-test phases, whereby the power conversion unit 112 does not supply voltage or current to the other non-test phase of the induction motor 114.

Figure 12:
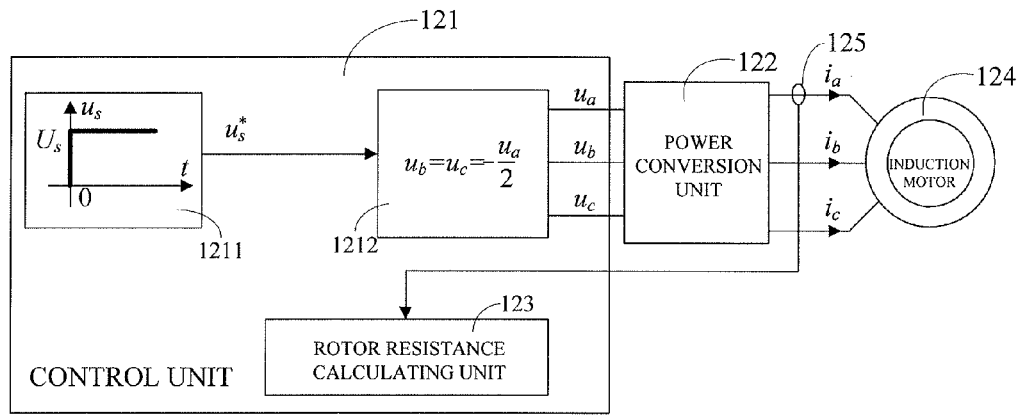
FIG. 12 is a block diagram illustrating an apparatus for measuring the rotor resistance of the induction motor according to an embodiment in the present application.

FIG. 12 shows an embodiment of an apparatus for testing the rotor resistance adopting the first embodiment and the voltage-type converter. In detail, the measuring unit in the present embodiment may be Hall element 125, and the control unit 121 includes a voltage command generator 1211, a voltage distributing module 1212 and a rotor resistance calculating unit 123. The voltage command generator 1211 is configured to send a voltage command to the voltage distributing module 1212, the voltage distributing module 1212 is configured to generate a three-path initial voltage step signal according to the first manner of making the three-phase induction motor 124 at standstill and then send it to the power conversion unit 122, and the power conversion unit 122 is configured to amplify the power of the initial voltage step signal to be a first voltage step signal and then inject it into the induction motor 124, for example, the voltage relation satisfies $u_s^* = u_a = -2u_b = -2u_c$ such that the induction motor 124 is at standstill. Then, the voltage command generator 1211 of the control unit is configured to send a voltage command to the voltage distributing module 1212, the signal is converted into the first voltage step signal by the power conversion unit 122 and then is injected into the a-phase of the induction motor 124. Finally, the rotor resistance calculating unit 123 is configured to measure the rotor resistance by using the above equation (6) on the basis of the current signal of the a-phase of the induction motor collected by the Hall element 125.

Figure 13:
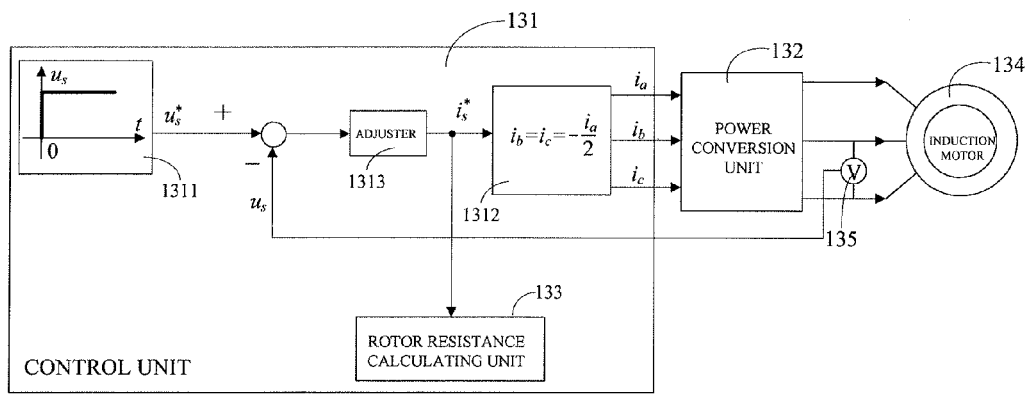
FIG. 13 is a block diagram illustrating an apparatus for measuring the rotor resistance of the induction motor according to an embodiment in the present application.

FIG. 13 shows an embodiment of an apparatus for testing the rotor resistance adopting the first embodiment and the current-type converter. In detail, the measuring unit in the present embodiment may be Hall element 135, and the control unit 131 includes a voltage command generator 1311, a current distributing module 1312, a current adjuster 1313, and a rotor resistance calculating unit 133. The voltage command generator 1311 is configured to send a voltage command to the current adjuster 1313, the current adjuster 1313 is configured to convert the voltage signal into a current signal and then send it to the current distributing module 1312, the current distributing module 1312 is configured to generate a three-path current signal according to the first manner of making the three-phase induction motor 134 at standstill and then send it to the power conversion unit 132, and the power conversion unit 132 is configured to amplify the power of the current signal and then inject the amplified signal into the induction motor 134, for example, the current relation satisfies $i_s^* = i_a = -2i_b = -2i_c$ such that the induction motor 134 is at standstill. Then, the control unit is configured to send a voltage command to the current adjuster 1313, the current adjuster 1313 is configured to convert the voltage signal into a current signal and then send it to the current distributing module 1312. After that, the current signal is converted into a first voltage step signal by the power conversion unit 132 and then is injected into the a-phase of the induction motor 134. Finally, the Hall element 135 is configured to supply the collected current signal output from the current adjuster 1313 to the rotor resistance calculating unit 133, and then the process of measuring the rotor resistance is completed by using the above equation (6).

Similarly, the second to fifth embodiments may be implemented by using the measuring apparatuses mentioned in the above two embodiments and the rotor resistance may be calculated according to the equation (7), which are omitted here.

Although the present application has been described with reference to several typical embodiments, it shall be understood that the terms used herein is to illustrate rather than limit the present application. The present application can be implemented in many particular embodiments without departing from the spirit and scope of the present application, thus it shall be appreciated that the above embodiments shall not be limited to any details described above, but shall be interpreted broadly within the spirit and scope defined by the appended claims. The appended claims intend to cover all the modifications and changes falling within the scope of the appended claims and equivalents thereof.

What is claimed is:

1. A method for measuring a rotor resistance of an induction motor, comprising:
    injecting a first voltage step signal into a test phase of the induction motor when the induction motor is at standstill;
    measuring and recording a current value $I_{0+}$ at an initial moment of the first voltage step signal, a first current value $I_{s1}$ and a second current value $I_{s2}$, the first current value $I_{s1}$ being equal to a steady-state current value corresponding to a voltage value before a step of the first voltage step signal, and the second current value $I_{s2}$ being equal to a steady-state current value corresponding to a voltage value after the step of the first voltage step signal; and
    calculating the rotor resistance $R_r$ of the induction motor based on the first current value $I_{s1}$, the second current value $I_{s2}$ and the current value $I_{0+}$ at the initial moment,
    wherein the rotor resistance $R_r$ is calculated according to an equation $$R_r \approx R_s \cdot \frac{I_{s2} - I_{0+}}{I_{0+} - I_{s1}},$$

in which $R_s$ represents a stator resistance,
    wherein the induction motor is a three-phase induction motor, and the method further comprises controlling the three-phase induction motor at standstill,
    wherein the controlling the three-phase induction motor at standstill comprises:
        setting a voltage input to the test phase of the three-phase induction motor twice as large as a voltage input to the other two phases while setting a direction of the voltage input to the test phase opposite to that of the voltage input to the other two phases; or
        setting the voltage input to the test phase of the three-phase induction motor equal to a voltage input to one phase of the other two phases while setting the direction of the voltage input to the test phase opposite to that of the voltage input to the one phase, and no voltage is supplied to a remaining phase of the other two phases; or
        setting a current input to the test phase of the three-phase induction motor twice as large as a current input to the other two phases while setting a direction of the current input to the test phase opposite to that of the current input to the other two phases; or setting the current input to the test phase of the three-phase induction motor equal to a current input to one phase of the other two phases while setting the direction of the current input to the test phase opposite to that of the current input to the one phase, and no current is supplied to a remaining one phase of the other two phases.

2. The method according to claim 1, wherein the current value $I_{0+}$ at the initial moment is a current value at any time point $T_1$ within a range of $T_0 < T_1 < T_0 + 3T_s$, wherein $T_0$ is a time point at which the first voltage step signal is voltage stepped, $$T_s = \frac{L_m + L_\sigma}{R_s},$$

$L_\sigma$ represents a leakage inductance, $L_m$ represents a mutual inductance, and $R_s$ represents a stator resistance.

3. The method according to claim 1, wherein the first current value $I_{s1}$ and the second current value $I_{s2}$ are measured and recorded before and after the step of the first voltage step signal, respectively.

4. The method according to claim 3, wherein the second current value $I_{s2}$ is a current value after elapse of a time period greater than or equal to $3T_s$ from the step of the first voltage step signal, $$T_s = \frac{L_m + L_\sigma}{R_s},$$

$L_\sigma$ represents a leakage inductance, $L_m$ represents a mutual inductance, and $R_s$ represents a stator resistance.

5. The method according to claim 1, wherein both the first current value $I_{s1}$ and the second current value $I_{s2}$ are less than or equal to $2I_N$, where $I_N$ represents a rated current of the induction motor.

6. The method according to claim 1, wherein the first voltage step signal is a positive step signal.

7. The method according to claim 6, wherein a magnitude of a voltage before or after the step of the first voltage step signal is 0.

8. The method according to claim 6, wherein a magnitude of a voltage before the step of the first voltage step signal is negative, and a magnitude of a voltage after the step of the first voltage step signal is positive.

9. The method according to claim 1, wherein the first voltage step signal is a negative step signal.

10. The method according to claim 9, wherein a magnitude of a voltage before or after the step of the first voltage step signal is 0.

11. The method according to claim 9, wherein a magnitude of a voltage before the step of the first voltage step signal is positive, and a magnitude of a voltage after the step of the first voltage step signal is negative.

12. The method according to claim 1, wherein the first voltage step signal is a multi-step voltage step signal.

13. An apparatus for measuring a rotor resistance of an induction rotor, comprising:
a power converter configured to couple to the induction motor;
a controller configured to inject a first voltage step signal into a test phase of the induction motor via the power converter when the induction motor is at standstill, wherein the controller comprises a processor configured to receive and record a current value $I_{0+}$ at an initial moment of the first voltage step signal and calculate the rotor resistance $R_r$ based on a first current value $I_{s1}$, a second current value $I_{s2}$ and the current value $I_{0+}$ at the initial moment, the first current value $I_{s1}$ being equal to a steady-state current value corresponding to a voltage value before a step of the first voltage step signal, and the second current value $I_{s2}$ being equal to a steady-state current value corresponding to a voltage value after the step of the first voltage step signal, and wherein the rotor resistance $R_r$ is calculated according to an equation $$R_r \approx R_s \cdot \frac{I_{s2} - I_{0+}}{I_{0+} - I_{s1}},$$

in which $R_s$ represents a stator resistance,
wherein the power converter comprises a voltage-type converter, the induction motor is a three-phase induction motor, and the processor is configured to receive and record the current values measured on the test phase of the induction motor, and the controller is configured to set a voltage input to the test phase of the three-phase induction motor twice as large as a voltage input to the other two phases while set a direction of the voltage input to the test phase opposite to that of the voltage input to the other two phases; or the controller is configured to set the voltage input to the test phase of the three-phase induction motor equal to a voltage input to one phase of the other two phases while set the direction of the voltage input to the test phase opposite to that of the voltage input to the one phase, and no voltage is supplied to a remaining one phase of the other two phases, such that the three-phase induction motor is at standstill.

14. The apparatus according to claim 13, wherein the current value $I_{0+}$ at the initial moment is a current value at any time point $T_1$ within a range of $T_0 < T_1 < T_0 + 3T_s$, wherein $T_0$ is a time point at which the first voltage step signal is voltage stepped, $$T_s = \frac{L_m + L_\sigma}{R_s},$$

$L_\sigma$ represents a leakage inductance, $L_m$ represents a mutual inductance, and $R_s$ represents a stator resistance.

15. The apparatus according to claim 13, further comprising a measuring meter configured to measure and record the first current value $I_{s1}$ and the second current value $I_{s2}$ before and after the step of the first voltage step signal, respectively, and the processor is configured to receive and record the first current value $I_{s1}$ and the second current value $I_{s2}$, the first current value $I_{s1}$ being the steady-state current value corresponding to the voltage value before the step of the first voltage step signal, and the second current value $I_{s2}$ being the steady-state current value corresponding to the voltage value after the step of the first voltage step signal and being a current value after elapse of a time period greater than or equal to $3T_s$ from the step of the first voltage step signal, wherein $$T_s = \frac{L_m + L_\sigma}{R_s},$$

$L_σ$ represents a leakage inductance, $L_m$ represents a mutual inductance, and $R_s$ represents a stator resistance.

16. An apparatus for measuring a rotor resistance of an induction rotor, comprising:

a power converter configured to couple to the induction motor;

a controller configured to inject a first voltage step signal into a test phase of the induction motor via the power converter when the induction motor is at standstill, wherein the controller comprises a processor configured to receive and record a current value $I_{0+}$ at an initial moment of the first voltage step signal and calculate the rotor resistance $R_r$ based on a first current value $I_{s1}$, a second current value $I_{s2}$ and the current value $I_{0+}$ at the initial moment, the first current value $I_{s1}$ being equal to a steady-state current value corresponding to a voltage value before a step of the first voltage step signal, and the second current value $I_{s2}$ being equal to a steady-state current value corresponding to a voltage value after the step of the first voltage step signal, and wherein the rotor resistance $R_r$ is calculated according to an equation $$R_r \approx R_s \cdot \frac{I_{s2} - I_{0+}}{I_{0+} - I_{s1}},$$

in which $R_s$ represents a stator resistance, the power converter comprises a current-type converter, the induction motor is a three-phase induction motor, the controller further comprises a current adjuster, and the processor is configured to receive and record the current values output from the current adjuster, and the controller is configured to set a current input to the test phase of the three-phase induction motor twice as large as a current input to the other two phases while setting a direction of the current input to the test phase opposite to that of the current input to the other two phases; or the controller is configured to set the current input to the test phase of the three-phase induction motor equal to a current input to one phase of the other two phases while setting the direction of the current input to the test phase opposite to that of the current input to the one phase, and no current is supplied to a remaining one phase of the other two phases, such that the three-phase induction motor is at standstill.

\* \* \* \* \*